US009601352B2

(12) United States Patent
Ouerghi et al.

(10) Patent No.: US 9,601,352 B2
(45) Date of Patent: Mar. 21, 2017

(54) METHOD OF LOCALIZED ANNEALING OF SEMI-CONDUCTING ELEMENTS USING A REFLECTIVE AREA

(71) Applicant: Commissariat A L'Energie Atomique et aux Energies Alternatives, Paris (FR)

(72) Inventors: Issam Ouerghi, Grenoble (FR); Thomas Ernst, Morette (FR); Laurent Grenouillet, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/859,427

(22) Filed: Sep. 21, 2015

(65) Prior Publication Data
US 2016/0093507 A1 Mar. 31, 2016

(30) Foreign Application Priority Data
Sep. 30, 2014 (FR) ..................................... 14 59285

(51) Int. Cl.
*H01L 21/8238* (2006.01)
*H01L 21/324* (2006.01)
(Continued)

(52) U.S. Cl.
CPC ...... *H01L 21/324* (2013.01); *H01L 21/02675* (2013.01); *H01L 23/552* (2013.01);
(Continued)

(58) Field of Classification Search
CPC ............. H01L 27/1248; H01L 27/1274; H01L 31/0547; H01L 21/324; H01L 23/552;
(Continued)

(56) References Cited

U.S. PATENT DOCUMENTS

| 8,803,206 B1 | 8/2014 | Or-Bach et al. |
| 2007/0155102 A1 | 7/2007 | Goldbach et al. |

(Continued)

FOREIGN PATENT DOCUMENTS

JP 2003-289080 10/2003

OTHER PUBLICATIONS

French Preliminary Search Report issued May 20, 2015 in French Application 14 59285, filed on Sep. 30, 2014 ( with English translation of categories of Cited Documents).
(Continued)

*Primary Examiner* — Thinh T Nguyen
(74) *Attorney, Agent, or Firm* — Oblon, McClelland, Maier & Neustadt, L.L.P.

(57) ABSTRACT

A method of making crystal semi-conducting material-based elements, including providing a support having amorphous semi-conducting material-based semi-conducting elements, the support being further provided with one or more components and with a reflective protective area configured so as to reflect a light radiation in a given wavelength range, exposing the element(s) to a laser radiation emitting in the given wavelength range so as to recrystallize the elements, the reflective protective area being arranged on the support relative to the elements and to the components so as to reflect the laser radiation and protect the components from this radiation.

11 Claims, 7 Drawing Sheets

(51) Int. Cl.
*H01L 31/054* (2014.01)
*H01L 23/552* (2006.01)
*H01L 31/18* (2006.01)
*H01L 21/02* (2006.01)
*H01L 27/12* (2006.01)
*H01L 21/762* (2006.01)
*H01L 21/265* (2006.01)

(52) U.S. Cl.
CPC ...... H01L 27/1248 (2013.01); H01L 27/1274 (2013.01); H01L 31/0547 (2014.12); H01L 31/1864 (2013.01); H01L 31/1872 (2013.01); *H01L 21/2652* (2013.01); *H01L 21/76224* (2013.01); *H01L 27/1203* (2013.01); *H01L 2924/0002* (2013.01)

(58) Field of Classification Search
CPC ........... H01L 21/02675; H01L 31/1872; H01L 31/1864; H01L 2924/0002; H01L 2924/00; H01L 21/76224
USPC ............... 438/218, 219, 294, 353, 400, 663; 257/499, 66, 69
See application file for complete search history.

(56) References Cited

U.S. PATENT DOCUMENTS

2010/0143744 A1* 6/2010 Gupta ................ B23K 26/0084
                                                            428/601
2013/0241026 A1  9/2013 Or-Bach et al.

OTHER PUBLICATIONS

Perrine Batude et al. "3-D Sequential Integration: A Key Enabling Technology for Heterogeneous Co-Integration of New Function with CMOS", IEEE Journal on Emerging and Selected Topics in Circuits and Systems, vol. 2, No. 4, 2012, 9 pages.
B. Rajendran et al. "Thermal Simulation of Laser Annealing for 3D Integration", Department of Applied Physics, Stanford University, 6 pages.
Yoel Fink et al. "Block Copolymers as Photonic Bandgap Materials", Journal of Lightwave Technology, vol. 17, No. 11, 1999, 7 pages.
Tien-Fu Chen et al. "A Novel Four-Mask-Processed Poly-Si TFT Fabricated Using Excimer Laser Crystallization of an Edge-Thickened α-Si Active Island", IEEE Electron Device Letters, vol. 25, No. 6, 2004, 3 pages.
G. K. Giust et al. "Comparison of excimer laser recrystallized prepatterned and unpatterned silicon films of SiO2", Journal of Applied Physics 81, 1997, 9 pages.
R. Ishihara et al. "Monolithic 3D-ICs with single grain Si thin film transistors", Solid-state Electronics 71, 2012, 8 pages.
Y.T. Liu et al. "Thermal Accumulation Improvement for Fabrication Manufacturing of Monolithic 3D Integrated circuits", IEEE 2008, 4 pages.
Julien Venturini "Laser Thermal Annealing: Enabling ultra-low thermal budget processes for 3D junctions formation and devices", IEEE, 2012, 6 pages.
Huaxiang Yin et al. "Advanced Poly-Si TFT with Fin-Like Channels by ELA", IEEE Electron Device Letters. vol. 27, No. 5, 2006, 3 pages.

* cited by examiner

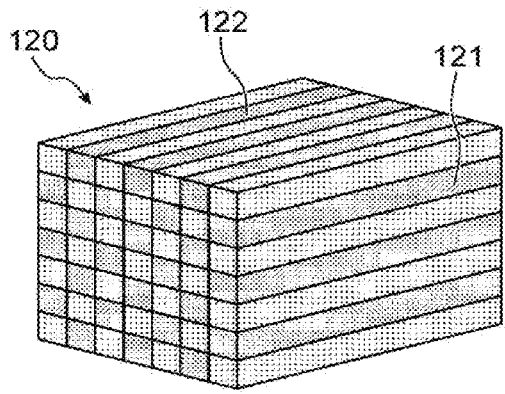 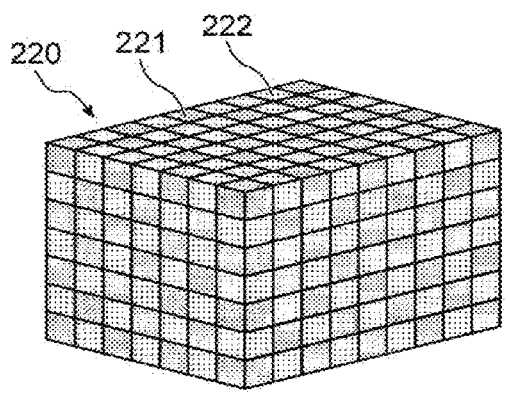
FIG.12A        FIG.12B
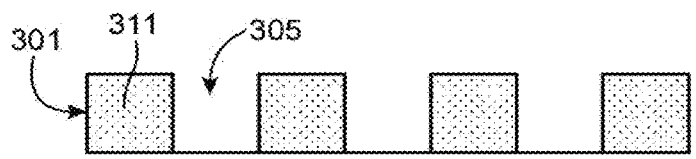
FIG.13A
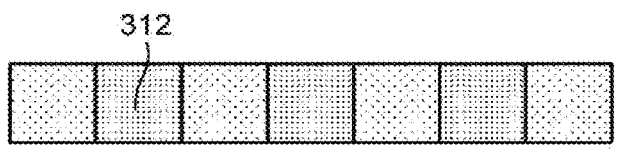
FIG.13B
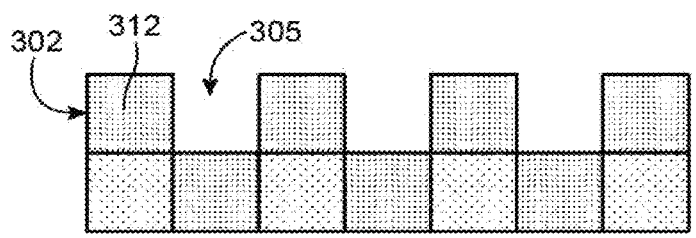
FIG.13C
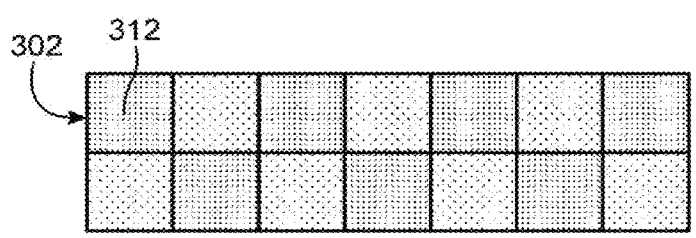
FIG.13D

METHOD OF LOCALIZED ANNEALING OF SEMI-CONDUCTING ELEMENTS USING A REFLECTIVE AREA

TECHNICAL FIELD AND PRIOR ART

The present invention relates to the field of making semi-conducting material-based structures.

To modify the atomic arrangement of a semi-conducting material and carry out, for example, a crystallization or a recrystallization of the semi-conducting material or even an activation of dopants in this material, it is known to carry out a thermal annealing by exposing this material to a radiation for example of a laser type.

In the case of an at least partially amorphous material having dopants, crystallization and activation of dopants can be made in a same annealing.

A laser annealing has the advantage of being localized, such that the temperature rise of the semi-conducting material can be made while limiting overheating of layers situated close to, and in particular under, this material.

This annealing method is for example used when implementing TFT (Thin Film Transistor) transistors on a substrate, often a glass-based substrate, to manufacture screens or is employed for example in manufacturing solar cells.

The laser annealing then enables the thermal budget to which the substrate is submitted to be limited. However, a heat transfer to the underlying layers cannot be avoided most of the time.

To limit the overheating of layers situated under an amorphous silicon layer which is to be crystallized, it is known to provide this silicone layer with a sufficiently significant thickness to enable the laser beam to be absorbed.

Furthermore, when the semi-conducting material to be crystallized is Si and the laser source is selected in the UV radiation field, a heat transfer of Si towards underlying layers is limited due to the good Si absorption properties in this wavelength range.

In spite of these techniques, modifying the atomic arrangement of low thickness semi-conducting layers is a problem.

Document "Thermal Accumulation Improvement for Fabrication Manufacturing of Monolithic 3D Integrated Circuits", by Liu and al., IEEE ICSICT, 2008, presents a solution to the overheating problem of underlying layers to a semi-conducting layer desired to be recrystallized.

It consists in introducing a copper layer between the layer to be recrystallized and a substrate on which the amorphous semi-conducting layer lies. Thanks to a significant thermal conductivity of copper, heat is dispersed into the plane of the copper layer which enables a heat propagation to be avoided in the underlying layers.

However, such a method causes energy efficiency problems insofar as the thermal energy absorbed by the copper is lost. Furthermore, with such a solution, a heat removal system can prove to be necessary. Further, with this method, copper can tend to deteriorate as soon as the annealing temperature exceeds a threshold in the order of 300° C.

The problem arises of a finding a new method which does not have the above drawbacks and enables the modification of the atomic arrangement of one or more semi-conducting material-based elements and which are disposed on a support, and this without damaging one or more components disposed under these elements.

DISCLOSURE OF THE INVENTION

The aim of the present invention is to resolve the above-mentioned problems, by providing the integration of a reflective area on a support on which one or more semi-conducting elements, which are intended to be exposed to a laser source, in particular to carry out a crystallization or recrystallization annealing of the semi-conducting element(s) and/or an activation of dopants in the semi-conducting element(s), the reflective area being configured so as to reflect a light radiation coming from the laser source.

The reflective protective area is a photonic crystal advantageously of a Bragg memory type, or forming a 2-dimensional or 3-dimensional lattice.

When the reflective protective area is formed by a stack of layers constituting a Bragg mirror, a significant reflectivity greater than 95% can be obtained.

The Bragg mirror can be formed by a stack having an alternation of layers based on at least a first dielectric material and of layers based on at least a second dielectric material.

A non-metallic reflective protective area avoids possible leakage currents and the creation of stray capacitances.

A reflective protective area of dielectric material has a lower thermal conductivity than a metal area, which enables a better heat preservation within the irradiated semi-conducting element(s).

The reflective protective area is further arranged on the support relative to the elements and one or more components integrated to the support so as to provide a protection of the components against the light radiation.

"Component" means an active element, this active element can be electronic (for example a transistor, a memory) or electromechanical (such as for example a MEMS sensor) or photonic (such as for example a light radiation emitting device). The term component also covers here a passive element such as for example an interconnection, a waveguide, a floorplan, a reflector, an inductance, a capacitance.

An embodiment of the present invention provides a method for modifying the atomic arrangement of semi-conducting elements by annealing, comprising the steps of:

a) providing a support having one or more semi-conducting elements the atomic arrangement of which is desired to be modified, the support being further provided with one or more components and at least one reflective protective area configured so as to reflect a light radiation in a given wavelength range, b) exposing the element(s) to a radiation emitting in said given wavelength range so as to carry out an annealing of said element(s), the reflective protective area being arranged on the support relative to said element(s) and to the component(s) so as to reflect the radiation and protect the component(s) from this radiation, while allowing the exposure of the element(s) to the radiation.

Advantageously, the reflective protective area is a photonic crystal.

The used radiation source is advantageously a laser. A localized annealing can then be implemented.

The used wavelength range is adapted to the semi-conducting material of the elements to enable the modification of the atomic arrangement of the semi-conducting material based on which they are formed.

Reflective area means in particular an area with a reflectivity of at least 70% in the considered wavelength range. The protective area can advantageously be configured to reflect at least 90% of the light radiation.

According to a possible implementation of this method, modifying the atomic arrangement of the semi-conducting elements comprises crystallizing or recrystallizing a semi-conducting material based on which the semi-conducting elements are formed.

According to a possible implementation of this method for which the semi-conducting elements are based on a doped semi-conducting material, modifying the atomic arrangement of the semi-conducting material can comprise activating dopants in this semi-conducting material.

Thus, the semi-conducting elements can initially be amorphous and annealing then enables to make them crystalline (polycrystalline or monocrystalline).

The semi-conducting elements can initially be amorphous and doped, annealing then enabling to make them crystalline and to carry out an activation of dopants by integrating them to the crystal lattice of the material.

The semi-conducting elements can initially be crystalline and doped, annealing then enabling to carry out an activation of the dopants by integrating them to the crystal lattice of the material.

According to a possible implementation, the reflective protective area is disposed on the components and the semi-conducting elements are disposed on the reflective protective area, so that during exposure to laser, the reflective protective area is situated between the semi-conducting elements and the components, and enables the light radiation to be reflected on the semi-conducting elements while protecting the components from this radiation.

According to another possible implementation, the elements can be disposed under the protective area and facing at least in part openings made in the protective area.

In this case, the semi-conducting elements can take part in protecting components by absorbing the light radiation.

As an alternative, the semi-conducting elements can be disposed in openings made in the reflective protective areas.

In this case too, the semi-conducting elements can take part in protecting components by absorbing the light radiation.

According to a possible implementation of the method, the reflective protective area can be temporarily disposed on the support.

Thus, when the elements to be crystallized or recrystallized do not lie on the reflective protective area and are situated in the openings made in this area or at the bottom of openings made in this reflective protective area, after the step of exposing the elements to laser, the reflective protective area can be removed from the support.

According to a possible implementation of the method, the elements in step a) can be previously formed by structuring a semi-conducting material layer.

An embodiment of the present invention provides a structure comprising: a support provided with one or more components and with one or more semi-conducting elements formed above the components, the structure further comprising at least one reflective protective area situated above the components and configured to reflect a radiation in a given wavelength range, the reflective protective area being arranged relative to the semi-conducting elements and to the components, so as to reflect the light radiation and protect the components from this radiation.

Advantageously, the reflective protective area is in the form of a photonic crystal.

The reflective protective area can be formed on or above the components, the semi-conducting elements being formed on or above the reflective protective area.

An alternative provides elements disposed at least in part under the protective area and at least in part facing the openings.

Another alternative embodiment provides semi-conducting elements being disposed in the openings of a reflective protective area.

BRIEF DESCRIPTION OF THE DRAWINGS

The present invention will be better understood upon reading the description of given exemplary embodiments, purely by way of indication and in no way limitation, by referring to the accompanying drawings in which:

FIGS. 12A-12B illustrate exemplary reflective areas respectively forming a 2D photonic crystal and a 3D photonic crystal;

FIGS. 13A-13D illustrate an exemplary method for making a reflective area in the form of 2D or 3D photonic crystal.

Identical, similar or equivalent parts of the different figures bear the same reference numerals so as to facilitate switching from one figure to the other.

The different parts represented in the figures are not necessarily drawn to a uniform scale, to make the figures more understandable.

Furthermore, in the description thereafter, terms depending on the orientation of the structure such as "on", "under", "above", "below", "at the bottom", apply considering that the structure is orientated in the manner illustrated in the figures.

DETAILED DISCLOSURE OF PARTICULAR EMBODIMENTS

Figure 1:
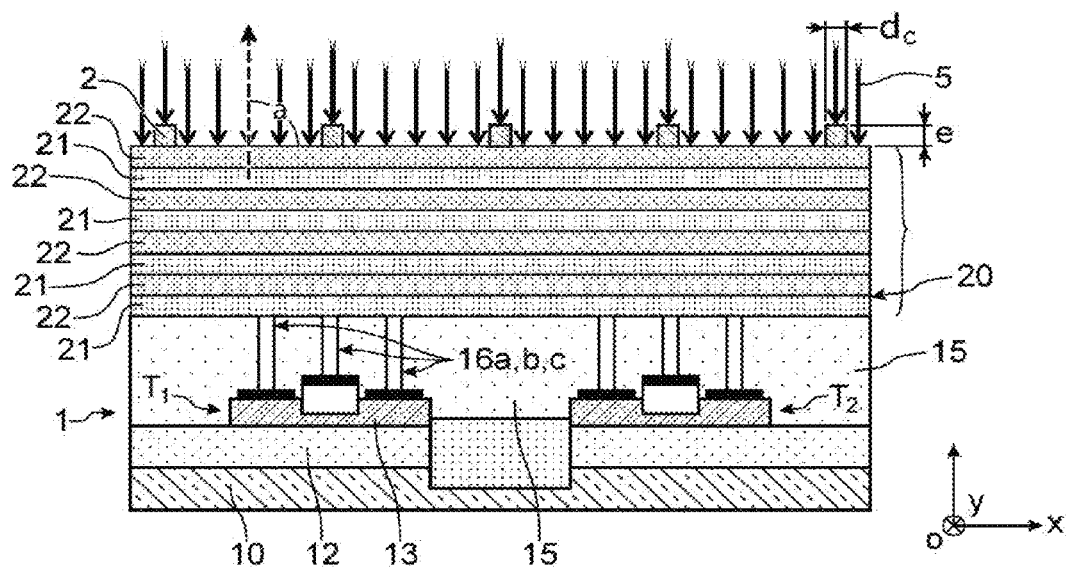
FIG. 1 illustrates an exemplary method and an exemplary device for modifying the atomic arrangement of semi-conducting elements and in particular for carrying out a crystallization or recrystallization of semi-conducting elements or an activation of dopants in the semi-conducting elements, these elements being disposed on a support provided with components, the support being protected by a reflective area in the form of a photonic crystal such as a Bragg mirror during exposure of the elements to a laser radiation.

An exemplary method for modifying the atomic arrangement of semi-conducting elements 2 by exposure to a light radiation, is illustrated in FIG. 1. In this exemplary embodiment the light radiation source used is a laser source.

As a function of the semi-conducting material based on which the elements 2 are formed, this modification of the atomic arrangement can for example consist in crystallizing or recrystallizing the semi-conducting material based on which the semi-conducting elements 2 are formed or activating dopants in this semi-conducting material, or both crystallizing and activating dopants.

The semi-conducting elements 2 can be based on an amorphous material or a material which was made amorphous, such as for example amorphous Si which is exposed to the laser 5 to give it or give it again a crystalline structure.

In this case, when for example the semi-conducting elements 2 are based on boron- or phosphorous-doped amorphous silicon, an activation of dopants can be made at a temperature in the order of 900° C., whereas recrystallization of the amorphous silicon is made at a temperature in the order of 600° C. For this exemplary material, implementing an activation of dopants thus implies a crystallization or recrystallization.

As an alternative, the laser 5 can be used only to carry out an activation of dopants, the semi-conducting elements 2 being in this case based on a crystalline semi-conducting material. When for example the semi-conducting elements 2 are based on a boron- or phosphorous-doped monocrystalline silicon, an activation of dopants at a temperature in the order of 900° C. does not necessarily imply a modification of a crystalline structure of the monocrystalline silicon.

According to another alternative, the semi-conducting elements 2 can have a portion of amorphous material and a portion of crystalline semi-conducting material.

The semi-conducting elements 2 the atomic arrangement of which is desired to be modified have a critical dimension dc (measured parallel to a plane [O; x; y] of an orthogonal reference frame [O; x; y; z]), also referred to as width, which can be for example between 1 nm and 10 µm.

The elements 2 also have a thickness (measured parallel to the axis z of the orthogonal reference frame [O; x; y; z]) also referred to as height which can be for example between 1 nm and 1 µm. Elements 2 thicker than 30 nm can be advantageously crystallized or recrystallized or undergo an activation of dopants by absorbing most of the laser beam.

The elements 2 can have been formed by structuring a semi-conducting material layer; this layer can have been formed by a transfer on a support.

The semi-conducting elements 2 can belong to an active part of an electronic device, for example be intended to form channels of a transistor, or of an electromechanical system or of an electrochemical or photonic sensor.

The laser source 5 used can for example emit in the UV field at a wavelength for example in the order of 308 nm. According to another example, an Nd-YAG (Neodymium-doped Yttrium Aluminium Garnet)-type laser emitting at a wavelength for example in the order of 532 nm can be used.

The light radiation has an incidence according to a non-zero angle α, for example of 90° with the principal plane of a support 1 (the principal plane of the support being defined as a plane passing through the latter and parallel to the plane [O; x; y] of the orthogonal reference frame [O; x; y; z]) on which the semi-conducting elements 2 are disposed. This angle α can be advantageously modulated in order to improve recrystallization.

The semi-conducting elements 2 lie on a support 1 provided with one or more electronic and/or electromechanical components that are desired to be protected from the laser radiation 5. To do this, a reflective area 20 is provided on the components. In the exemplary embodiment of FIG. 1, the reflective area 20 is disposed under the semi-conducting elements 2.

The support 1 can be for example a microelectronic device provided with electronic components such as transistors $T_1$, $T_2$ formed on a substrate 10 which can be of the semiconductor-on-insulator type, for example of the SOI (Silicon-On-Insulator)-type. The substrate thus comprises a semi-conducting support layer, which can be Si-based, an insulating layer 11, for example silicon oxide-based, situated on and in contact with the support layer 10, the insulating layer 11 being for example of the BOX (Buried Oxide)-type and covered with a semi-conducting layer 12 known as "superficial" in which the respective channel areas of transistors and possibly part of their source and drain regions are made. Transistors $T_1$, $T_2$ can be covered with an insulating layer 15, for example $SiO_2$-based, through which the contacting areas 16a, 16b, 16c on the source, gate and drain regions of transistors $T_1$, $T_2$ are formed. In this exemplary embodiment, the insulating layer 15 is itself covered with the reflective area 20. This reflective area 20 is configured to reflect the laser light radiation 5, the wavelength of which can be for example in the order of 308 nm or 532 nm, which enables crystallization or recrystallization of elements 2 disposed on the latter to be improved. The reflective area 20 has a high reflectivity, in particular of at least 70%, also enabling the transistors $T_1$ and $T_2$ situated under this area to be protected from the radiation 5.

In this particular exemplary embodiment, the reflective area 20 disposed between the elements to be crystallized or recrystallized and the component(s) to be protected comprises a stack of layers of materials 21, 22 with different refractive indices and distributed according to a periodic arrangement. The periodic arrangement of layers 21, 22 forms a Bragg mirror-type photonic crystal.

The stack comprises k (with k an integer greater than 1) layers of a first material 21 having a first refractive index $n_1$ and m (with m an integer greater than 1) layers of a second material 22 having a second refractive index $n_2$. This stack can in particular be formed by an alternation of layers based on the first material 21 and of layers based on the second material 22.

The first material 21 can advantageously be a dielectric such as for example $Si_3N_4$ whereas the second material 22 can also advantageously be a dielectric such as for example $SiO_2$. When the layers of this stack are chosen based on a dielectric material, this enables the formation of stray capacitances to be avoided and the introduction of interconnection elements (not shown in FIG. 1) passing through this reflective protective area to be promoted. Such an embodiment is advantageous particularly when the semi-conducting structures are disposed at an upper level which is commonly referred to as the "back end" of a CMOS device.

The layers based on the first dielectric material 21 and those based on the second dielectric material 22 can have a thickness for example between 1 nm and 10 µm.

The number of layers and the respective thicknesses of the layers of materials 21, 22 are then adjusted as a function of the desired reflectivity, the latter increasing with the number of layers of materials 21, 22.

Figure 2:
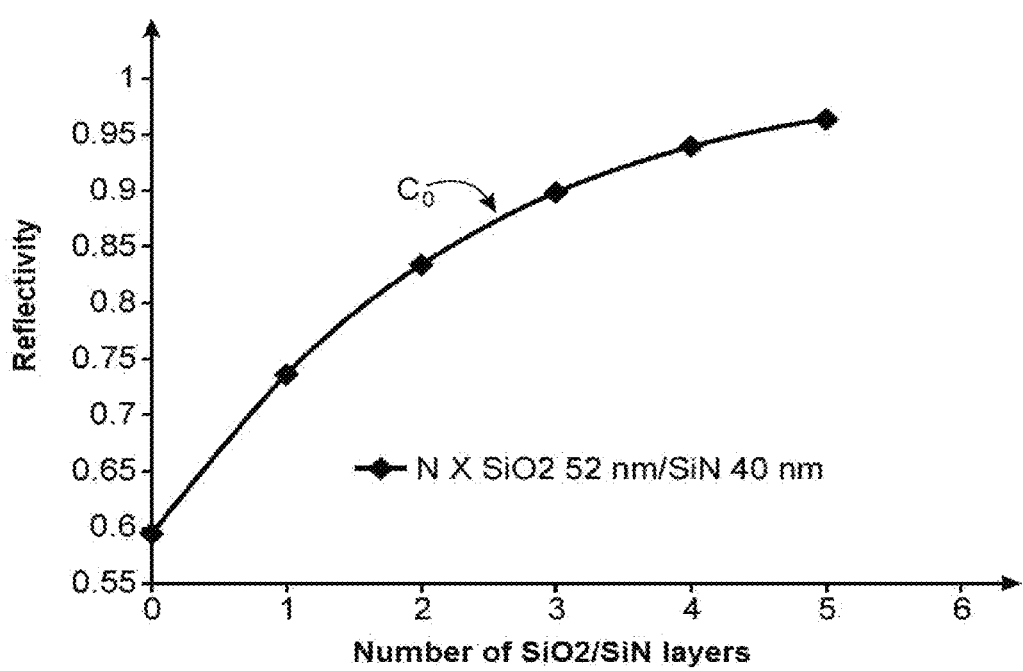
FIG. 2 shows a reflectivity curve of a stack forming the Bragg mirror as a function of the number of layers in this stack.

The exemplary curve $C_0$ shown in FIG. 2 shows an evolution of reflectivity at a wavelength of 308 nm as a function of the number N of $SiO_2$ layers with a thickness in the order of 52 nm and of SiN layers in the order of 40 nm according to a stack such as illustrated in FIG. 1. According to this curve $C_0$ from a number N=5, a Bragg mirror with a reflectivity coefficient in the order of 0.95 can advantageously be implemented.

Figure 3:
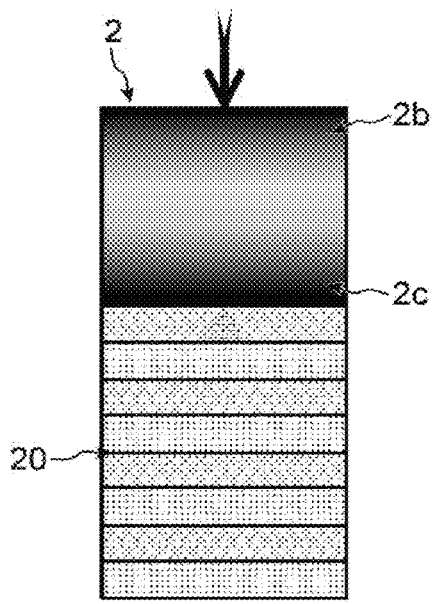
FIG. 3 illustrates a phenomenon of light absorption of a semi-conducting element submitted to a laser radiation and disposed above a reflective area such as implemented in a method and a device according to the invention.

With such a device, the optical absorption (illustrated in FIG. 3 by dense areas on a semi-conducting element 2) in an upper area 2b of the elements 2 is in the order of 1-Rc, Rc being the reflectance of the elements 2, whereas in a lower area 2c of the elements 2 situated against the reflective area 20, the optical absorption is in the order of 1-Rc-Tm, Tm being the transmittance of the reflective area 20 which is very low, which enables the absorption of the laser radiation by elements 2 to be increased and thus their recrystallization to be improved.

In the exemplary embodiment of FIG. 1, the semi-conducting elements are formed on and in contact with the reflective area. As an alternative, one or more interface layers can be provided between the reflective area 20 and the semi-conducting elements 2.

Figure 4:
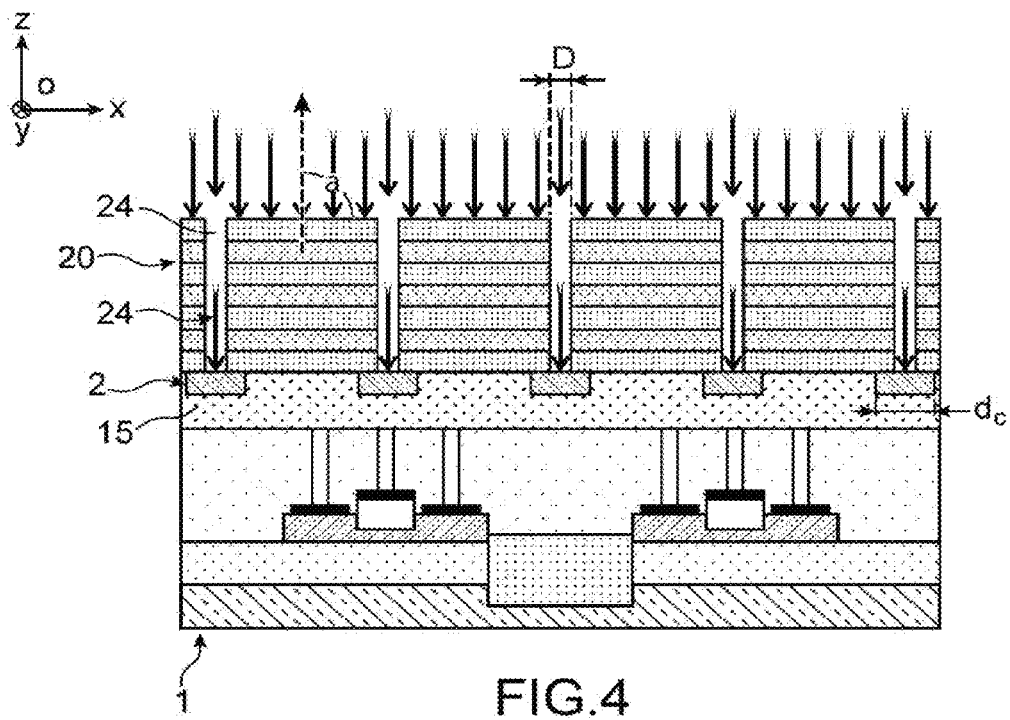
FIG. 4 illustrates another embodiment in which the semi-conducting elements exposed to the laser are disposed at the bottom of openings provided in the reflective area.

Another arrangement of the protective area 20 and of the semi-conducting elements 2 is shown in FIG. 4. In this example, the semi-conducting elements 2 are disposed under the reflective protective area 20 and revealed by the openings 24 provided through this area 20. The openings 24 made in the stack of dielectric material layers 21, 22 can have a diameter D (measured parallel to a plane [O; x; y] of an orthogonal reference frame [O; x; y; z] in FIG. 4) which can be for example between 10 nm and 100 µm and can be provided lower than the critical dimension dc of the elements 2.

The semi-conducting elements 2 situated at the bottom of the openings 24 can be distributed on the insulating layer 15 and possibly partially in this insulating layer 15 covering transistors $T_1$, $T_2$.

In this configuration, the semi-conducting elements 2 are partially encapsulated, which can enable a modification of their morphology to be avoided when the crystallization or recrystallization or dopant activation annealing reaches a significant temperature in particular close to the melting temperature of the semi-conducting material.

Figure 5:
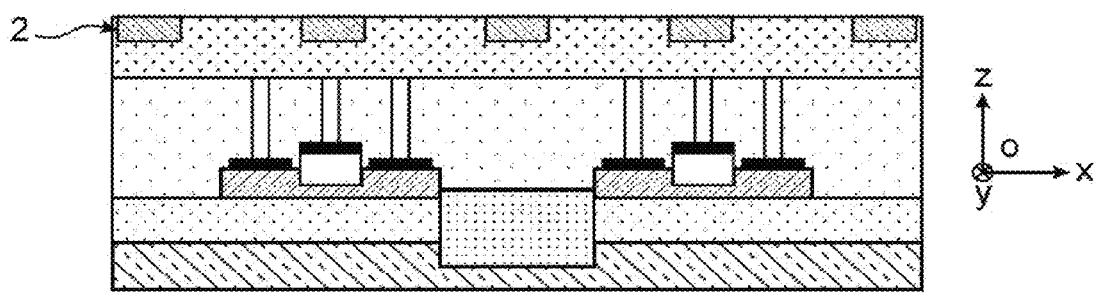
FIG. 5 illustrates a step of removing the reflective area after exposure of the elements to the laser radiation.

In this exemplary embodiment, the reflective area 20 can be temporarily disposed on the elements 2 and removed once the laser crystallization is made (FIG. 5). Such a removal can be made for example by CMP polishing and then wet etching.

Figure 6:
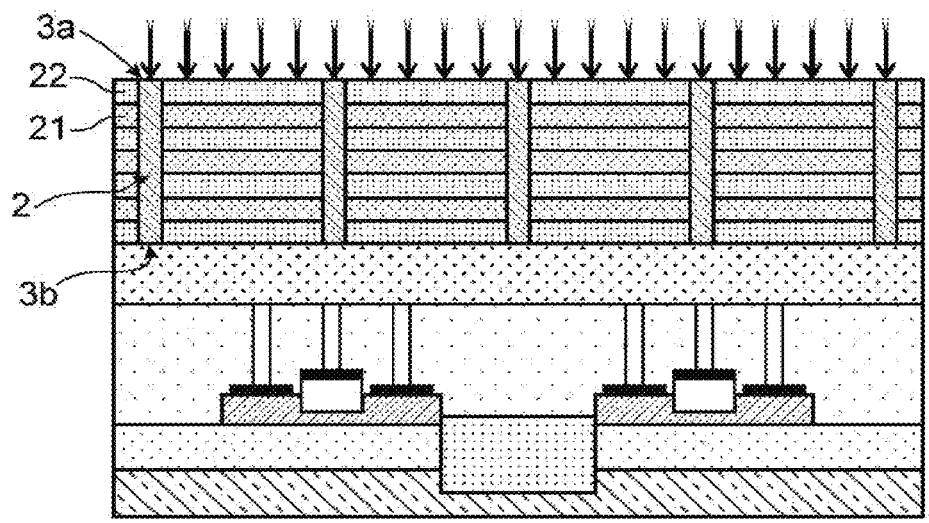
FIG. 6 illustrates another embodiment in which the semi-conducting elements are disposed in the openings passing through the reflective area.
Figure 7:
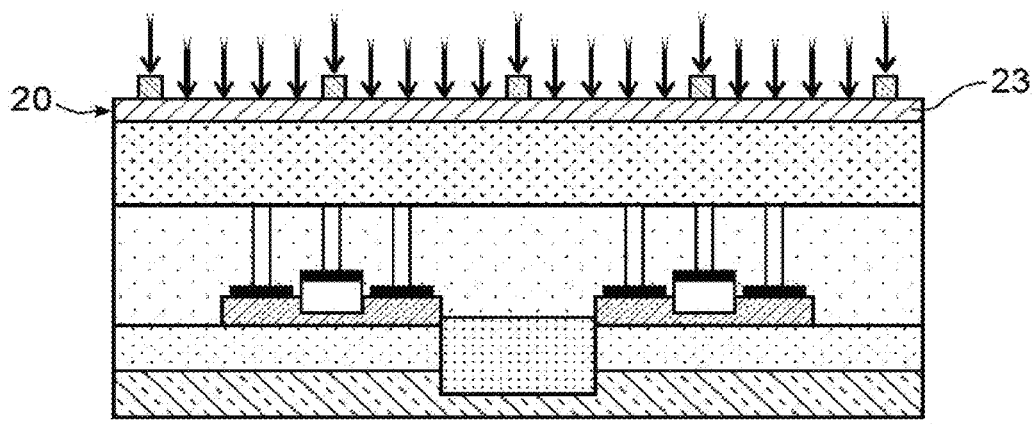
FIG. 7 illustrates a method and a device for carrying out a modification of the atomic arrangement of semi-conducting elements disposed on a support provided with components, the support being protected by a metallic reflective area.
Figure 8:
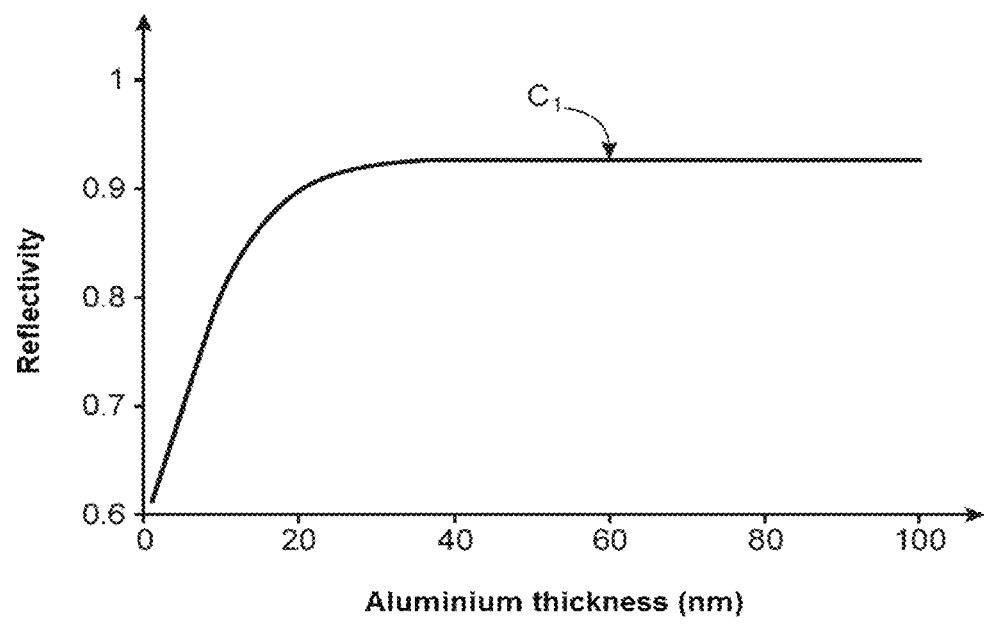
FIG. 8 shows a reflectivity curve of an aluminium-based reflective layer as a function of its thickness.

FIG. 6 illustrates another exemplary arrangement in which, this time, the semi-conducting elements 2 are disposed in the openings 24 situated in the reflective protective area 20 and passing through the latter.

The elements 2 filling the openings 24 have an end 3a opening into the upper face of the stack of dielectric layers 21, 22, which is exposed to the laser radiation 5. Another end 3b of the semi-conducting elements opens at the lower face of the stack and can be connected to a contact or connection zone (not shown) of components integrated into the support.

In this exemplary embodiment, the semi-conducting elements 2 can have the shape of a column or a vertical pillar and can be intended to form vertical conducting elements. These vertical conducting elements can for example perform connections commonly referred to as vias for a 3D monolithic device, or even transistor channels.

In this configuration as in the one previously described in relation to FIG. 4, part of the laser radiation penetrating through the openings 24 is absorbed by the elements 2 which then also act as a protection for the transistors $T_1$, $T_2$ against the laser radiation 5.

An alternative implementation provides a reflective area 20 formed by a metallic material 23-based thin reflective layer having a high reflectivity towards the laser radiation. The thickness and the material of the thin reflective layer are chosen so as to impart to it a reflectivity in particular greater than 70%.

This metallic material 23 can be for example aluminium (Al) or Rhodium (Rh) or for example an aluminium and copper-based metal alloy.

For a laser source 5 emitting at 308 nm, an Al-based metallic layer with a thickness in the order of 50 nm can for example have a reflectivity in the order of 93%, whereas an AlCu-based metallic layer of the same thickness can have, for example, a reflectivity in the order of 91% and an Rh layer can have a reflectivity, for example, in the order of 74%. Such a layer can be formed, for example, by sputtering at a temperature lower than 300° C.

Figure 9:
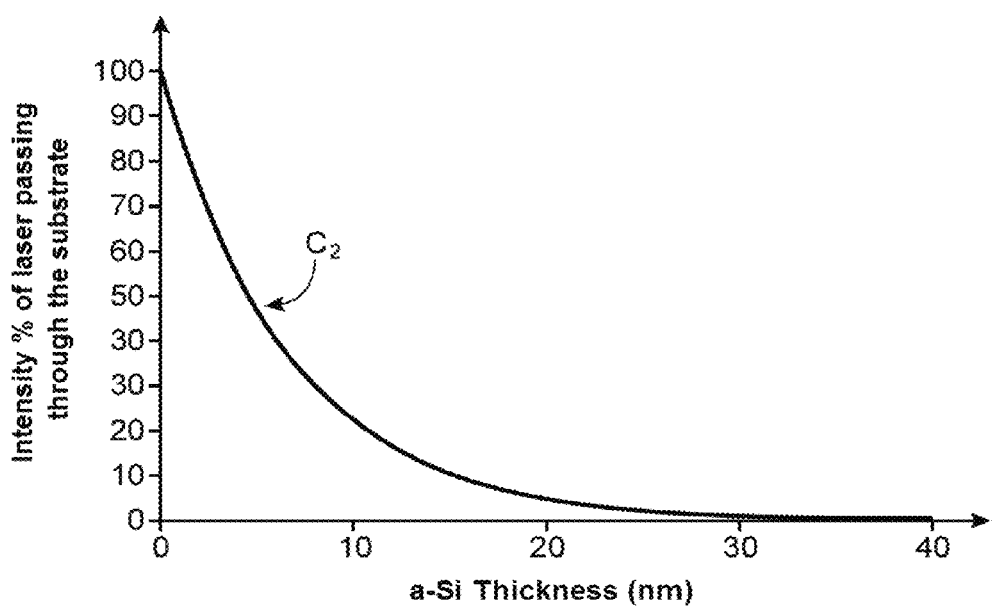
FIG. 9 shows an exemplary laser radiation intensity curve passing through a Si-based amorphous semi-conducting layer as a function of its thickness.

FIG. 9 shows an exemplary reflectivity curve $C_1$ of an aluminium-based layer, as a function of its thickness, for a laser radiation emitting at a wavelength of 308 nm. This curve $C_1$ shows that beyond a thickness in the order of 30 nm, a reflectivity greater than 90% can be achieved.

Exposure to a laser 5 according to either of the arrangements of reflective area 20 which have just been described can also be implemented to carry out an activation of dopants, when the semi-conducting elements 2 are doped. Such an activation can be made for example to form junctions in the semi-conducting elements 2.

In either of the exemplary embodiments which have been previously described, the semi-conducting elements are formed by structuring a layer.

As an alternative, a recrystallization or an activation also known as "full plate" can be made, the semi-conducting element which is recrystallized or for which an activation of dopants is carried out then being a layer which is not yet structured and which can be possibly structured latter.

FIG. 9 shows an exemplary curve $C_2$ of a laser energy percentage with a wavelength of 308 nm passing through an amorphous Si layer as a function of its thickness. This curve shows the interest of implementing a reflective area 20 under such a layer since beyond a certain thickness of the Si layer, the laser energy is hardly absorbed and transmitted to underlying layers.

An exemplary method for making a structure such as illustrated in FIG. 1 will now be given in relation to FIGS. 10A-10C.

The starting material of the method is in this example the microelectronic device comprising the transistors $T_1$, $T_2$ formed on the semiconductor-on-insulator type substrate 10 and covered by the insulating layer 15.

Figure 10A:
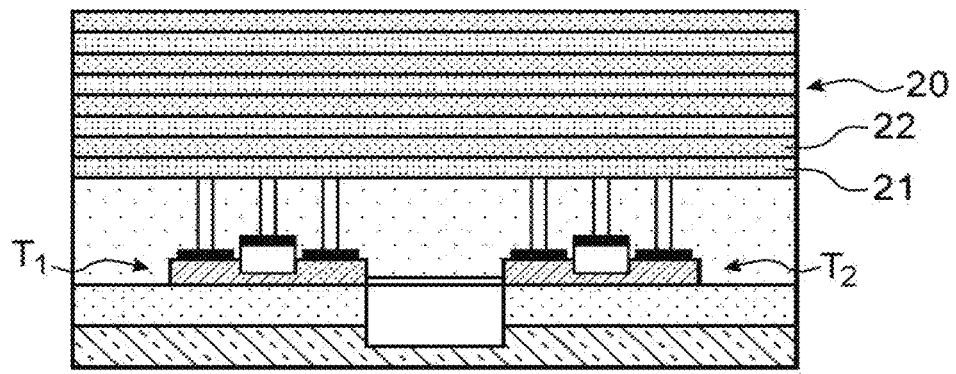
FIGS. 10A-10C illustrate an exemplary method for making a structure according to the invention, previously to an exposure to a laser.

On this insulating layer 15, the reflective protective area 20 is first made as an alternation of first dielectric material 21, for example $Si_3N_4$, -based layers, and second dielectric material 22, such as for example, $SiO_2$, -based layers (FIG. 10A).

To do this, successive depositions are implemented using for example a PECVD (Plasma Enhanced Chemical Vapour Deposition)-type technique at a low temperature, for example lower than 300° C. in order to maintain a low thermal budget.

Figure 10B:
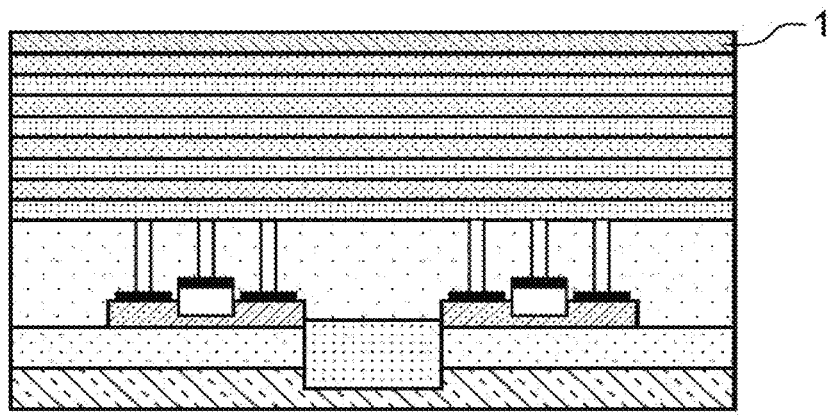

Then, a semi-conducting layer 1 is formed (FIG. 10B). According to a particular exemplary embodiment, in the case where the semi-conducting layer 1 is based on a crystalline material, the layer can be formed by transfer on the protective area 20.

Figure 10C:
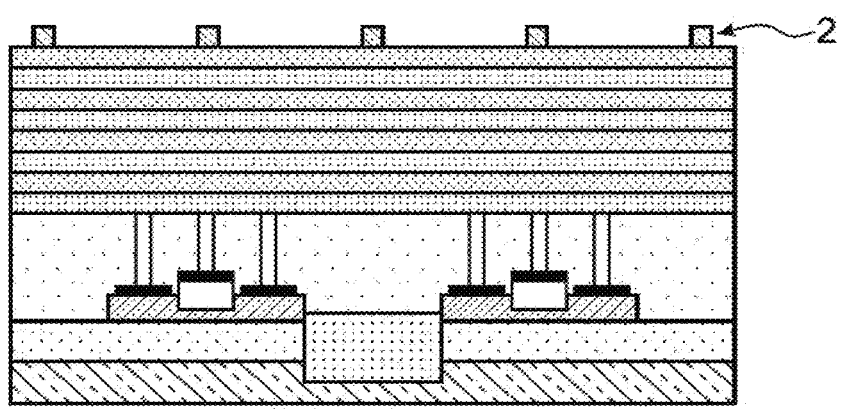

Patterns are then formed in this semi-conducting layer 1, for example by photolithography and then etching, so as to make the semi-conducting elements 2 (FIG. 10C).

Figure 11A:
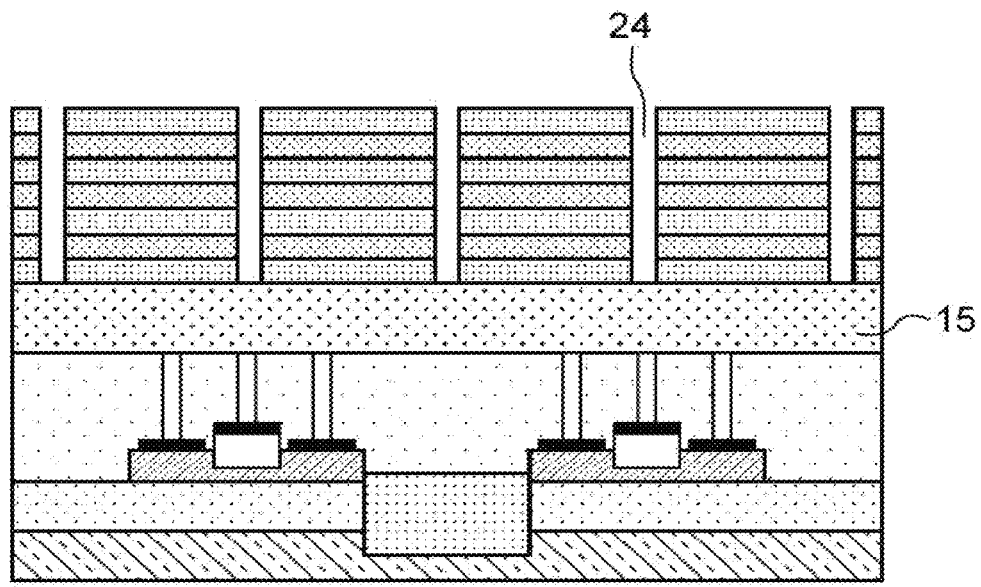
FIGS. 11A-11B illustrate another method for making a structure according to the invention.

An alternative of this exemplary method enables a structure such as illustrated in FIG. 6 to be made. To do this, after the step of forming the stack of dielectric layers forming a Bragg mirror, openings 24 passing through this stack can be made and the bottom of which reveals the insulating layer 15 (FIG. 11A).

Figure 11B:
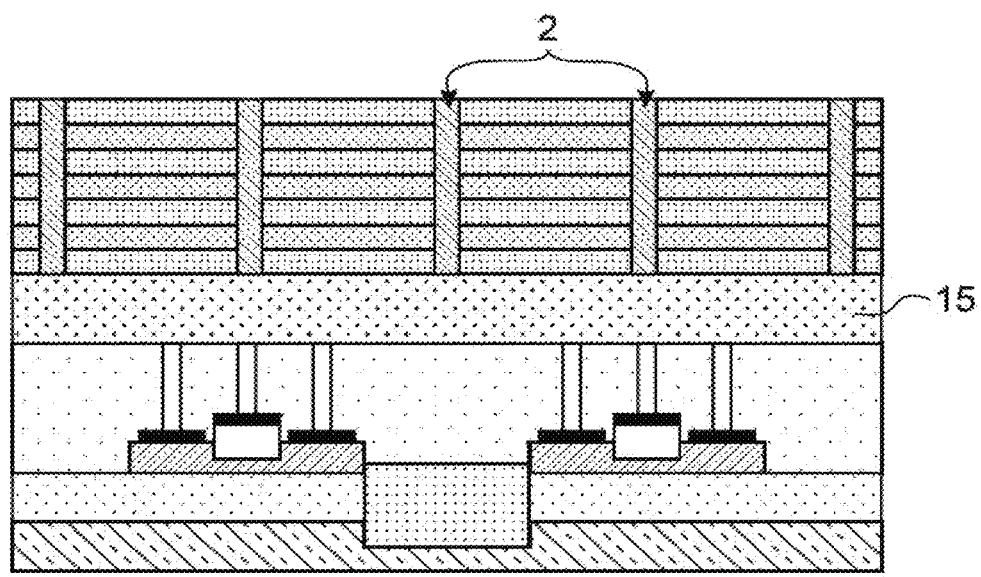

Then, these openings 24 are filled using semi-conducting material, in order to form semi-conducting elements 2 passing through the stack making a Bragg mirror. Then, a planarization, for example by CMP (Chemical Mechanical Polishing) can be made to remove the semi-conducting material protruding from the aperture of the openings 24 (FIG. 11B).

According to another alternative, a structure such as illustrated in FIG. 4 can be made, by forming holes in the insulating layer 15, then by filling these holes with a semi-conducting material, so as to form semi-conducting elements 2 (FIG. 5).

An alternative implementation of the device illustrated in FIG. 1 provides the replacement of the reflective area 20 forming a Bragg mirror type photonic crystal by another photonic crystal type having a 2-dimensional or 3-dimensional lattice.

An exemplary embodiment of the reflective area 20 forming a photonic crystal is illustrated in FIG. 12A. The photonic crystal can here have a periodic lattice of parallelepiped elements 121, 122 respectively based on a first material and a second material having a refractive index different from the one of the first material and which are alternatively distributed over 2 dimensions. A stack of juxtaposed parallelepiped rods distributed so as to obtain a reflective area with a periodic variation of the refractive index in 2 directions is here formed.

According to another exemplary embodiment illustrated in FIG. 12B, the photonic crystal can have a periodic lattice of cubic elements 221, 222 respectively based on a first material and a second material having a refractive index different from the one of the first material, the cubic elements 221, 222 being distributed over 3 dimensions. A stack of juxtaposed cubic elements distributed so as to obtain a reflective area with a periodic variation of the refractive index in 3 directions is here formed.

A photonic crystal formed by a 2D or 3D lattice enables to obtain a reflectivity on a wider band than a Bragg mirror-type 1D lattice. This can allow a tolerance regarding the accuracy with which the incidence angle of the laser 5 is set.

An exemplary method for forming a 2D photonic crystal such as illustrated in FIG. 12A or for forming a 3D photonic crystal such as illustrated in FIG. 12B will now be described in relation to FIGS. 13A-13C.

A first layer 301 based on a material 311 with a first refractive index $n_1$ is first formed, for example a dielectric material such as SiN deposited by PECVD.

Holes 305 are then made in this first layer 301 for example using a deep ultraviolet (DUV) lithography technique or a lithography technique by means of an electron beam or for example using an embossing mould according to a technique commonly referred to as "nanoimprint" (FIG. 13A).

To make a 2D photonic crystal, the holes 305 can be for example in the form of parallelepiped trenches parallel to each other whereas for a 3D photonic crystal, the holes can be distributed over two dimensions and can for example have a cubic form.

The holes are then filled with a second material 312 having a second refractive index $n_2$, for example a dielectric material such as $SiO_2$. To remove the second material 312 which is possibly in excess and protrudes from the aperture of the holes 305, a CMP-type etching or polishing can then be made (FIG. 13B).

A second layer 302 is then formed based on the second material 312 (FIG. 13C).

Holes 305 are then made in this second layer 302 (FIG. 13C).

The holes are then filled with the first material (FIG. 13D).

The steps which have just been described can then be reiterated a given number of times as a function of the pitch desired to be given to the lattice.

As an alternative, a 2D photonic crystal can be made, formed by a single layer in order to advantageously enable the overall dimensions of the reflective area to be limited.

According to an alternative method for making the photonic crystal formed by a 2D or 3D lattice, each stage can be formed by a block-to-block copolymer layer which is reported.

Implementing layers known as "self-assembled" layers enables to dispense with conventional lithography methods with a mask. A manufacturing method using "self-assembled" layers is generally referred to as DSA (Directed Self-Assembly).

A method according to either of the previously described examples can be made to manufacture on-board memories or on-board sensors.

The invention claimed is:

1. A method for modifying the atomic arrangement of semi-conducting elements by annealing, comprising the steps of:
    providing a support having one or more semi-conducting elements the atomic arrangement of which is desired to be modified, the support being further provided with one or more components and with at least one reflective protective area, the reflective protective area being a photonic crystal and configured so as to reflect a light radiation in a given wavelength range,
    exposing the element(s) to a radiation emitting in said given wavelength range so as to carry out annealing of said element(s), the reflective protective area being arranged on the support relative to said element(s) and to component(s) so as to reflect the radiation and protect the component(s) from this radiation, while allowing the exposure of the element(s) to the radiation.

2. The method according to claim 1, wherein modifying the atomic arrangement of the semi-conducting elements comprises crystallizing or recrystallizing a semi-conducting material based on which the semi-conducting elements are formed.

3. The method according to claim 1, wherein the semi-conducting elements are based on a doped semi-conducting material, modifying the atomic arrangement of the semi-conducting material comprising activating dopants in this semi-conducting material.

4. The method according to claim 1, wherein the reflective protective area is configured to reflect at least 70% of the light radiation.

5. The method according to claim 1, wherein the reflective protective area is disposed above the components and wherein the elements are disposed above the reflective protective area, so that during exposure to light radiation, the reflective protective area is situated between the components and the elements.

6. The method according to claim 1, wherein the reflective protective area has openings, the elements being disposed at least in part under the protective area and at least in part facing the openings.

7. The method according to claim 4, wherein the reflective protective area has openings, the elements being disposed in the openings.

8. The method according to claim 6, comprising, after the exposing, removing the reflective protective area from the support.

9. The method according to claim 1, wherein the reflective protective area comprises a stack of layers forming a Bragg mirror.

10. The method according to claim 1, wherein the protective area is formed by a stack having an alternation of layers based on at least a first dielectric material and of layers based on at least a second dielectric material.

11. The method according to claim 1, wherein the semi-conducting elements are previously formed by structuring a semi-conducting material layer.

\* \* \* \* \*